(12) United States Patent
Wang et al.

(10) Patent No.: US 6,433,577 B1
(45) Date of Patent: Aug. 13, 2002

(54) LOW POWER PROGRAMMABLE LOGIC ARRAY ASSEMBLY

(75) Inventors: Jinn-Shyan Wang, Chia-Yi;
Ching-Rong Chang, Chi-Lung;
Ching-Wei Yeh, Ming-Hsiung Hsiang, all of (TW)

(73) Assignee: National Chung Cheng University, Chia-Yi County (TW)

( * ) Notice: Subject to any disclaimer, the term of this patent is extended or adjusted under 35 U.S.C. 154(b) by 0 days.

(21) Appl. No.: 09/932,392

(22) Filed: Aug. 17, 2001

(30) Foreign Application Priority Data

Apr. 20, 2001 (TW) ........................................ 90109496 A

(51) Int. Cl.⁷ ............................................ H03K 19/177
(52) U.S. Cl. ................................ 326/37; 326/38; 326/39
(58) Field of Search .................................. 326/38–41, 37

(56) References Cited

U.S. PATENT DOCUMENTS 4,962,327 A * 10/1990 Iwazaki ........................ 307/449
5,101,122 A * 3/1992 Shinonara .................... 307/465
5,719,505 A * 2/1998 Ditlow et al. .................. 326/39

* cited by examiner

Primary Examiner—Michael Tokar
Assistant Examiner—Vibol Tan
(74) Attorney, Agent, or Firm—J.C. Patents

(57) ABSTRACT

An assembling method for a low-power programmable logic array circuit. The assembling method is capable of reducing delays and unnecessary power consumption. According to the low potential power loss when the dynamic gates in the AND-plane and the OR-plane output a low potential, the high potential power loss when the dynamic gates in the AND-plane and the OR-plane output a high potential and the probability of the dynamic gates outputting a high potential, a selection between new dynamic logic circuit and conventional dynamic circuit is carried out. The conventional dynamic circuit in the AND-plane refers to a conventional dynamic circuit whereas the conventional dynamic circuit in the OR-plane refers to a conventional footless dynamic circuit

4 Claims, 16 Drawing Sheets

US 6,433,577 B1

LOW POWER PROGRAMMABLE LOGIC ARRAY ASSEMBLY

CROSS-REFERENCE TO RELATED APPLICATION

This application claims the priority benefit of Taiwan application serial no. 90109496, filed Apr. 20, 2001.

BACKGROUND OF THE INVENTION

1. Field of Invention

The present invention relates to a type of programmable logic array circuit. More particularly, the present invention relates to a low power programmable logic array assembly.

2. Description of Related Art

FIG. 1 is a block diagram of a conventional programmable logic array (PLA). As shown in FIG. 1, a programmable logic array mainly includes five major blocks an input buffer 102, an AND-plane circuit 104, an inter-plane buffer 106, an OR-plane circuit 108 and an output buffer 110. The AND-plane circuit 104 and the OR-plane circuit 108 provide a sum-of-product (SOP) logic. On the other hand, the input buffer 102, the inter-plane buffer 106 and the output buffer 110 provide necessary driving capability to the logic circuit. Normally, clock control signals are included to synchronize with an outside system.

A number of improved programmable logic array designs have also been developed. The following is a brief description of some of the improved PLA circuits.

A. Conventional Clock-delayed PLA

FIG. 2 is a circuit diagram of a 5×8×4 conventional clock-delayed PLA. As shown in FIG. 2, the clocked-delay PLA implements the Boolean functions $Z_1$~$Z_4$. The '5' in the 5×8×4 PLA indicates that the number of input variables is five (a, b, c, d and e). The '8' in the 5×8×4 PLA indicates that the number of product terms is eight (P1~P8). The '4' in the 5×8×4 PLA indicates that the number of output values is four ($Z_1$~$Z_4$). Furthermore, the Boolean functions are as follows:

$$Z_1 = ab\bar{d}e + \bar{a}b\bar{c}d\bar{e} + bc + de; \quad (1)$$

$$Z_2 = \bar{a}\bar{c}e; \quad (2)$$

$$Z_3 = bc + de + \bar{c}d\bar{e} + bd; \quad (3)$$

$$Z_4 = \bar{a}\bar{c}e + ce \quad (4)$$

In FIG. 2, an external clock control signal ψ produces two in-phase internal clock control signals $\psi_1$ and $\psi_{1d}$ applied to the AND-plane circuit 104 and the OR-plane circuit 108 respectively. A path marked in gray color is a critical path for this circuit. A critical path is a route that includes the largest loading from an input terminal to an output terminal of the circuit and hence operating speed depends upon the critical path.

FIG. 3A is a circuit taken from the critical path in FIG. 2 and FIG. 3B is a diagram showing a set of signal waveforms related to the circuit shown in FIG. 3A. Note that the clock control signal used by the AND-plane circuit 318 and the OR-plane circuit 322 are different. If both the AND-plane circuit 318 and the OR-plane circuit 322 use the same clock control signal, signal at node 6 will be destroyed by the pre-charging signal at node 5 in the evaluation phase initialization. This will lead to data race errors shown as gray-marked area in FIG. 3B. To prevent the data race errors, clocking signal to the OR-plane circuit 322 must be delayed.

One must wait until the data at node 5 is stabilized before carrying out any evaluation actions. This is the reason why this type of PLA is called a clock-delayed PLA. Hence, the main disadvantage of the clock-delayed PLA is the delay of clocking signal to the OR-plane circuit 322 to prevent data racing.

In FIG. 3B, a few time parameters are defined for analyzing operating speed of such a circuit. The following is a list of various timing definitions.

(1) External access time ($t_{acc}$): from the edge of the external clock signal ψ rising to a high potential to the signal at the output terminal changing potential;

(2) Internal access time ($t_{iacc}$): from the edge of the internal clock signal $\psi_1$ rising to a high potential to the signal at the output changing potential; and (3) Internal clocking time difference ($t_d$): time difference between the internal clock signal $\psi_1$ and the internal clock signal $\psi_{1d}$, obviously, if duty cycle of the clocking signal is 50%, the smallest operating cycle can be defined as twice the internal access time ($t_{iacc}$).

As shown in FIG. 3B, the value of td can surely affect $t_{acc}$ and $t_{iacc}$. Consequently, the critical path of a conventional clock-delayed circuit shown in FIG. 3A includes the AND function block 318, the inter-plane buffer 320, the OR function block 322 and the output buffer 324. The large parasitic capacitors $C_{AND}$, $C'_{AND}$, $C_{inter}$, $C_{OR}$ and $C'_{OR}$ along the critical path is a major reason for a slow-down of the operating speed in the circuit. Due to the absence of dc power consumption in a dynamic circuit, power is dominated mainly for dynamic power consumption. In general, the power consumption of a dynamic circuit is represented by $$P = \sum_{i=1}^{n} \alpha_i C_i V_{DD}^2 f.$$

Here, $\alpha_i$ the switching probability of node i, $C_i$ is the lumped capacitance of node i, $V_{DD}$ is the operating voltage and f is the frequency. If $V_{DD}$ and f has fixed values, the only consideration is the values of $\alpha_i$ and $C_i$. The product αC is defined as the power factor (PF). The critical path shown in FIG. 3A can be used to evaluate the operating speed of the circuit. Because power consumption of the PLA circuit is related to the implemented Boolean functions, power consumption determined from the critical path is not equivalent to the power consumption of the entire circuit. To simplify estimation of power consumption, the critical path is still employed as a base with the incorporation of switching probability according to the blocks shown in FIG. 1. Because the clocking signals are global signals, clocking signal is not included into the power consumption consideration.

The following is an observation of the power factors of various functional blocks.

(1) The input buffer 102: if probability of the input signal is evenly distributed, $\alpha_{IN}$ can be represented by $$\frac{1}{2} \cdot \frac{1}{2} = \frac{1}{4},$$

and power factor of the input buffer 102 is $\alpha_{IN} C_{IN}$.

(2) The AND-plane circuit 104 and the inter-plane buffer region 106: if the number of input is N, the switching probability of a dynamic NOR gate is $$\frac{2^N-1}{2^N}.$$

In other words, the switching probability of dynamic NOR gates in the AND-plane circuit 104 $\alpha_{AND}$ and $\alpha'_{AND}$ is $$\frac{2^N-1}{2^N}.$$

Because the inter-plane buffer region 106 will change according to the AND-plane circuit 104, switching probability $\alpha_{inter}$ is $$\frac{2^N-1}{2^N}$$

as well. If the number of inputs is very large, the value of $\alpha_{AND}$, $\alpha'_{AND}$ and 60 $_{inter}$ is close to one. Furthermore, due to the long interconnection wires and parasitic capacitors of transistors contribute to the capacitors $C_{AND}$, $C'_{AND}$, and $C_{inter}$, these capacitance are relatively large. Therefore, the power factors including $\alpha_{AND} \cdot C_{AND}$, $\alpha'_{AND} \cdot C'_{AND}$, and $\alpha_{inter} \cdot C_{inter}$ of such components are a leading factor of large power consumption.

(3) The OR-plane circuit 108. The switching probability in the OR-plane circuit 108 is mainly affected by the output from the inter-plane buffer 106. Assume the OR-plane circuit 108 is an N-input dynamic NOR gate and $p_i$ is the probability of the $i^{th}$ input of the dynamic NOR gate being one, transition probability $$\alpha_{OR} = 1 - \prod_{i=1}^{N}(1-p_i).$$

Hence, $\alpha_{OR} \cdot C_{OR}$ is related to the input and the desired function.

B. Blair's PLA

FIG. 4A is a circuit diagram showing a Blair's PLA and a critical path through the circuit. FIG. 4B is a timing diagram showing waveforms related to the signals in FIG. 4A. Because the AND-plane circuit 418 of the Blair's PLA uses a pre-discharged pseudo-NMOS circuit, operating speed in the AND-plane circuit 418 is affected. Since the pseudo-NMOS circuit is a type of ratioed logic, the conductance $\beta_P$ of PMOS transistor $M_{P1}$ very small. Furthermore, the PMOS transistor $M_{P1}$ needs to drive a large capacitor $C_{AND}$. This often leads to a slow rising edge of signal at node 2. Such phenomenon can be observed in the gray-marked area in FIG. 4B. The critical path of the Blair's PLA includes the AND-plane circuit 418, the inter-plane buffer 420, the OR-plane circuit 422 and the output buffer 424. One major advantage of Blair's PLA is a reduction in dynamic power consumption so that the dynamic power is principally dominated by $\alpha_{OR} \cdot C_{OR}$. According to FIG. 4B, charges at node 2 and node 4 are discharged to ground GND in the pre-charging phase. Since the probability maintaining a low potential at node 2 and node 4 approaches 1, the value of $\alpha_{AND}$ and $\alpha_{inter}$ approaches zero. This indicates that whatever the value of the capacitor $C_{AND}$ and the capacitor $C_{inter}$, the value of both $\alpha_{AND} \cdot C_{AND}$ and $\alpha_{inter} \cdot C_{inter}$ are very small. Although a Blair's PLA can reduce dynamic power loss, dc power loss in the circuit cancels out a portion of the advantage gained. Because the AND-plane circuit 418 uses a pre-charge pseudo-NMOS circuit, the probability of the AND-plane circuit 418 turning into a pseudo-NMOS is very high within the evaluation state of the circuit. Hence, a dc current is produced in the circuit. The dc power loss is intensified as the operating frequency is lowered. In brief, one major advantage of a Blair's PLA is a reduction in dynamic power loss. However, the advantage is often eclipsed by excessive dc power loss.

C. Dhong's PLA

FIG. 5A is a circuit diagram showing a Dhong's PLA and a critical path through the circuit. FIG. 5B is a timing diagram showing waveforms related to the signals in FIG. 5A. To prevent data race problem, the internal clock signal $\psi_{1d}$ must be delayed for a $t_d$ until signal at node 4 is stabilized. As the internal clock signal $\psi_{1d}$ rises to a high potential, circuit within the OR-plane circuit 516 initiates an evaluation operation. Since the delay $t_d$ is directly reflected in external access time, this is similar to the delay in a conventional clock-delayed PLA. In the pre-charging phase of the circuit, the capacitor $C_{IN}$ will discharge to a zero potential (ground GND) under the control of internal clock signals. Hence, actual input reaches node 2 only when the circuit is in the evaluation stage. This produces additional time delay leading to a longer access time. Furthermore, as the clock signal $\psi_{1d}$ in the OR-plane circuit 516 step into the evaluation phase, residual charges stored inside the capacitor $C_{share}$ start to redistribute to the capacitor $C_{OR}$. If all the inputs to the OR-plane circuit 516 are LOW, charge redistribution will pull node 5 to HIGH. The charge redistribution is effected by an N-type transistor. Due to body effect, rising speed at node 5 is slow. If at least one of the inputs to the OR-plane circuit 516 is at a high potential, the charges stored inside the capacitor $C_{share}$ may all leak away. In FIG. 5A, the gray-marked critical path includes a PMOS transistor 502 in the input section, the AND-plane circuit 512, the inter-plane buffer 514, the OR-plane circuit 516 and the output buffer 518. Overall length of the critical path is much longer than a conventional clock-delayed PLA and a Blair's PLA. Note that the internal access time $t_{iacc}$ in this circuit is calculated from node 1 to the output point Z1.

The following is an analysis of the power factors of a Dhong's PLA. Because Dhong's PLA uses a special input circuit, $\alpha_{IN}$, differs from a conventional clock-delayed PLA. In the pre-charging phase, the capacitors $C_{IN}$ is discharged to a zero potential (ground GND). Hence, $$\alpha_{IN} = \frac{1}{2} \cdot 1 = \frac{1}{2}.$$

In addition, the special input circuit adds parasitic capacitance to the capacitor $C_{IN}$. Consequently, power consumption in the input section of the circuit will increase in proportional to the power factor $\alpha_{IN} \cdot C_{IN}$. The AND-plane circuit 512 and the inter-plane buffer 514 are functionally similar to a conventional clock-delayed circuit. The main power factors are represented by $\alpha_{AND} \cdot C_{AND}$ and $\alpha_{inter} \cdot C_{inter}$. These two power factors contribute significant dynamic power loss to the circuit.

The following is a discussion of the power factor of the OR-plane circuit 516. In FIG. 5A, the capacitor $C_{share}$ must have a capacitance twice that of the capacitor $C_{OR}$. Two principal evaluation states must be considered, namely:
(1) If a high potential is obtained at node 5 in an evaluation operation, the voltage level will rise to $$\frac{2}{3}V_{DD}.$$

In other words, $$\frac{2}{3}V_{DD} \cdot C_{OR}$$

of the residual charges will be transferred to the node 5. However, the transferred electric charges will be discharged in the next pre-charging phase.
(2) If a low potential is obtained at node 5 in an evaluation operation, all the charges $V_{DD} \cdot 2C_{OR}$ originally stored inside the capacitor $C_{share}$ will leak away. The power loss at this moment is equivalent to $V_{DD}^2 \cdot 2C_{OR} \cdot f$. If switching probability is also includes into our consideration, from a statistical perspective, average power factor of the OR-plane circuit 516 is given by the formula:

$$PF_{OR} = \prod_{i=1}^{N}(1-p_i) \cdot \frac{2}{3}C_{OR} + \left[1 - \prod_{i=1}^{N}(1-p_i)\right] \cdot 2C_{OR}$$

Here, N is the number of inputs. >From the power factor formula, power loss in the OR-plane circuit 516 of a Dhong's PLA is larger than a conventional clock-delayed PLA. Furthermore, the special input circuit will decrease operating speed and increase additional power losses.

D. Wang's PLA

FIG. 6A is a circuit diagram showing a Wang's PLA and a critical path through the circuit. FIG. 6B is a timing diagram showing waveforms related to the signals in FIG. 6A. In Wang's original design, the clocking signal for controlling the AND-plane circuit 618 and the clocking signal for controlling the OR-plane circuit 622 are identical. However, such an arrangement often leads to data race problem. In the evaluation operation 1 shown in FIG. 6B, when the clock signal $\psi_1$ is at a high potential, the pair of inputs of the NAND gate 606 are at a high potential instantaneously. Ultimately, a falling and a rising glitch are produced at node 4 and 5 respectively. The upward rising glitch will switch on the dynamic gate of the OR-plane circuit 622. If the OR-plane circuit 622 gets into an evaluation state at the same time, the glitch at node 5 will produce an erroneous value. This is the so-called race problem.

To prevent race problem, the clocking signal to the OR-plane circuit 622 must be delayed until the glitch at node 5 completely disappears. In FIG. 6A, the clocking signal $\psi_{1d}$ to the OR-plane circuit 622 passes through delaying inverters 612 and 614 so that correct circuit operating sequence is ensured. This modified circuit is called an improved version of the Wang's PLA. In the evaluation operation 2 shown in FIG. 6B, the evaluation phase of node 3 and 5 when the value is in a high potential state is considered. When node 5 rises to a level $V_{DD}$ and $\psi_{1d}$ is not yet in an evaluation state, the dynamic gates inside the OR-plane circuit 622 produces some dc power loss. Node 6 cannot be pulled down to a ground (GND) potential. The node 6 is pulled to the ground level only when $\psi_{1d}$ proceeds to the evaluation state. Both the improved Wang's PLA and Dhong's PLA both uses a special input circuit. The only difference is that the Wang's PLA has an additional NMOS transistor 604 for producing a complete transmission gate. Hence, extra delay caused by the additional input circuit still causes an increase in the access time for the Wang's PLA.

As shown in FIG. 6A, the critical path includes the input transmission gate 602, 604, the AND-plane circuit 618, the inter-plane buffer 620, the OR-plane circuit 622 and the output buffer 624, similar to a Dhong's PLA. The internal access time $t_{iacc}$ of this circuit is also calculated from node 1 to the output point Z1. One of the most important design concept of the Wang's PLA is centered upon the inter-plane buffer 620, an AND type inter-plane buffer 620. When the clocking signals $\psi_1$ and $\psi_{1d}$ are both at a low potential, the circuit proceeds into the pre-charging phase. The nodes 3 and 6 are pre-charged to HIGH. Because one terminal of the NAND gate 606 is controlled by the clocking signal $\psi_1$, node 4 in the inter-plane buffer 620 is also pre-charged to a high potential level. Consequently, node 5 is pulled down to a low potential level. When the circuit proceeds into the evaluation phase, most of the input combinations pull node 3 to the ground (GND). Thus, node 5 is maintained at a low potential level under most circumstances. This indicates that switching probability for node 5 $\alpha_{inter}$ is relatively small and power factor $\alpha_{inter} \cdot C_{inter}$ the inter-plane buffer 620 can be safely ignored. However, considering about the transmission delay, glitches at nodes 4 and 5 appealed on initialization of evaluation. As shown in FIG. 6B, the glitches waste a portion of the dynamic power such that transition probability $\alpha_{inter}$ of the inter-plane buffer 620 is larger than expected. In brief, the advantage of a Wang's PLA lies in the AND type inter-plane buffer 620 design. However, the glitches at nodes 4 and 5 consume dynamic power. In addition, the special input circuit also increases power consumption and reduces operating speed.

A summary of all factors limiting the operating speed and the power factor of conventional dynamic PLAs is shown in Table 1 and Table 2.

TABLE 1

Factors limiting the operating speed of conventional PLAs.

| PLAs | Clock-delayed | Blair's | Dhong's | Modified Wang's |
|---|---|---|---|---|
| Limiting Factors | $\phi_{id}$ | Pseudo-NMOS circuit | $\phi_{id}$ | $\phi_{id}$ |
| | 2 large capacitors in one gate | — | Input circuit | Input circuit |
| | — | — | CS effect of the OR-plane circuit | Glitches of the inter-plane buffers |

TABLE 2

Power factors of conventional PLAs

| PLAs | $PF_{IN}$ | $PF_{AND}$ | $PF_{inter}$ | $PF_{OR}$ | $PF_{OUT}$ |
|---|---|---|---|---|---|
| Clock-delayed | $\frac{1}{4}(C'_{IN} + C_{IN})$ | $\frac{2^N - 1}{2^N}(C_{AND}C'_{AND})$ | $\frac{2^N - 1}{2^N}C_{inter}$ | $\left[1 - \prod_i(1 - p_i)\right] \cdot (C_{OR} + C'_{OR})$ | $\left[1 - \prod_i(1 - p_i)\right]C_L$ |
| Blair's | $\frac{1}{4}(C'_{IN} + C_{IN})$ | $\frac{2^N - 1}{2^N}\frac{P_{pc}}{V^2_{DD}f} + \frac{1}{2^N}C_{AND}$ | $\frac{1}{2^N}C_{inter}$ | $\left[1 - \prod_i(1 - p_i)\right]C_{OR}$ | $\left[1 - \prod_i(1 - p_i)\right]C_L$ |
| Dhong's | $\frac{1}{4}C'_{IN} + \frac{1}{2}C_{IN}$ | $\frac{2^N - 1}{2^N}C_{AND}$ | $\frac{2^N - 1}{2^N}C_{inter}$ | $\prod_i(1-p_i)\cdot\frac{2}{3}C_{OR} + \left[1 - \prod_i(1 - p_i)\right]\cdot 2C_{OR}$ | $\prod_i(1 - p_i)C_L$ |
| Modified Wang's | $\frac{1}{4}C'_{IN} + \frac{1}{2}C_{IN}$ | $\frac{2^N - 1}{2^N}C_{AND}$ | $< \frac{2^N - 1}{2^N}C_{inter}$ | $\left[1 - \prod_i(1 - p_i)\right]C_{OR}$ | $\prod_i(1 - p_i)C_L$ |

SUMMARY OF THE INVENTION

Accordingly, the present invention is to provide a low power programmable logic array circuit assembly that includes an AND-plane circuit and an OR-plane circuit. The AND-plane circuit includes AND-plane dynamic gates while the OR-plane circuit includes OR-plane dynamic gates. The assembling method includes the following steps. According to the AND-plane low potential power loss when a low potential is output from the AND-plane dynamic gates, the AND-plane high potential power loss when a high potential is output from the AND-plane dynamic gates and the probability of a high potential at the AND-plane when the AND-plane dynamic gates output a high potential, a selection between AND-plane new dynamic circuit and AND-plane conventional dynamic circuit is carried out to pick up an AND-plane operating circuit for the AND-plane. Between the AND-plane dynamic gates of the AND-plane new dynamic circuit outputting a low potential and the AND-plane dynamic gates of the AND-plane conventional dynamic circuit outputting a low potential, the former has a lower transition power loss, On the contrary, between the AND-plane dynamic gates of the AND-plane new dynamic circuit outputting a high potential and the AND-plane dynamic gates of the AND-plane conventional dynamic circuit outputting a high potential, the latter has a lower transition power loss.

According to OR-plane low potential power loss when a low potential is output from the OR-plane dynamic gates, OR-plane high potential power loss when a high potential is output from the OR-plane dynamic gates and probability of a high potential at the OR-plane when the OR-plane dynamic gates output a high potential, a selection between OR-plane new dynamic circuit and OR-plane conventional footless dynamic circuit is carried out to pick up an OR-plane operating circuit for the OR-plane. Between the OR-plane dynamic gates of the OR-plane new dynamic circuit outputting a low potential and the OR-plane dynamic gates of the OR-plane conventional footless dynamic circuit outputting a low potential, the former has a lower transition power loss. On the contrary, between the OR-plane dynamic gates of the OR-plane new dynamic circuit outputting a high potential and the OR-plane dynamic gates of the OR-plane conventional footless dynamic circuit outputting a high potential, the latter has a lower transition power loss. Finally, the selected AND-plane operating circuit and the selected OR-plane operating circuit are combined to produce the low power programmable logic array.

Base on simple analysis, each type of circuit design is advantageous under a particular set of operating conditions. This invention provides an innovative complementary metal-oxide-semiconductor (CMOS) programmable logic array circuit design having a circuit selection mechanism for using the best circuit under different sets of operating conditions.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
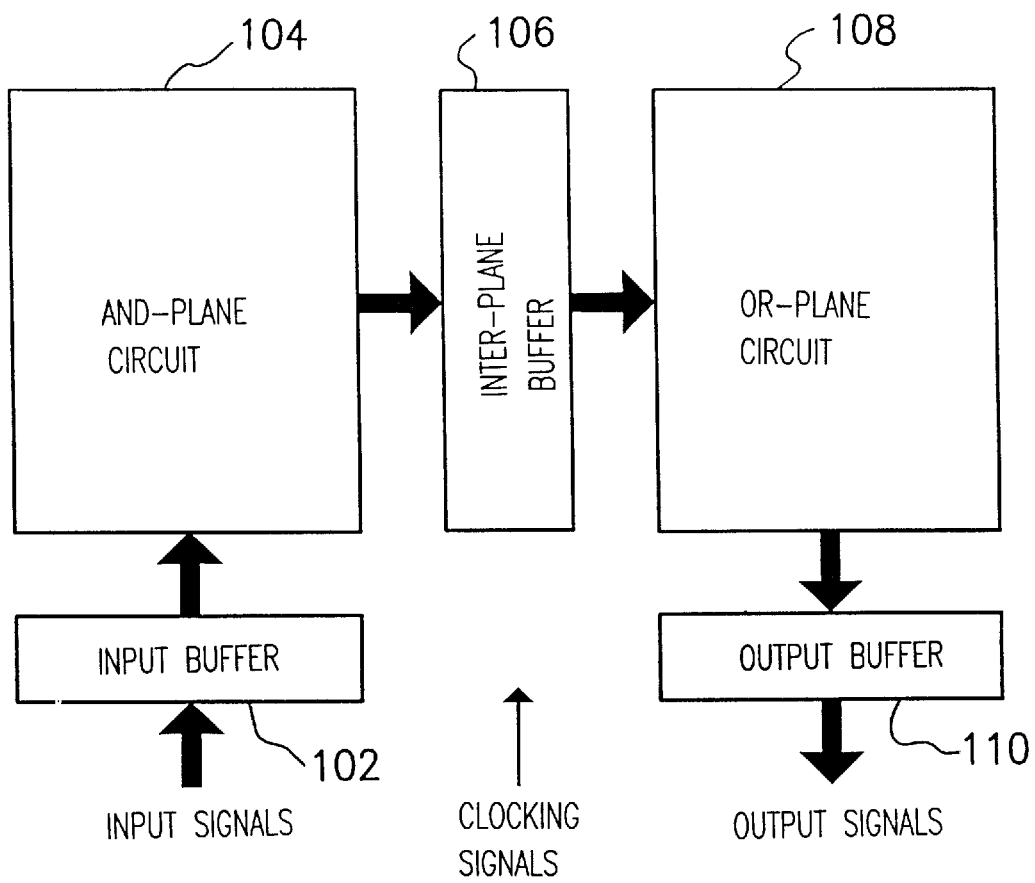
FIG. 1 is a block diagram of a conventional programmable logic array (PLA)
Figure 2:
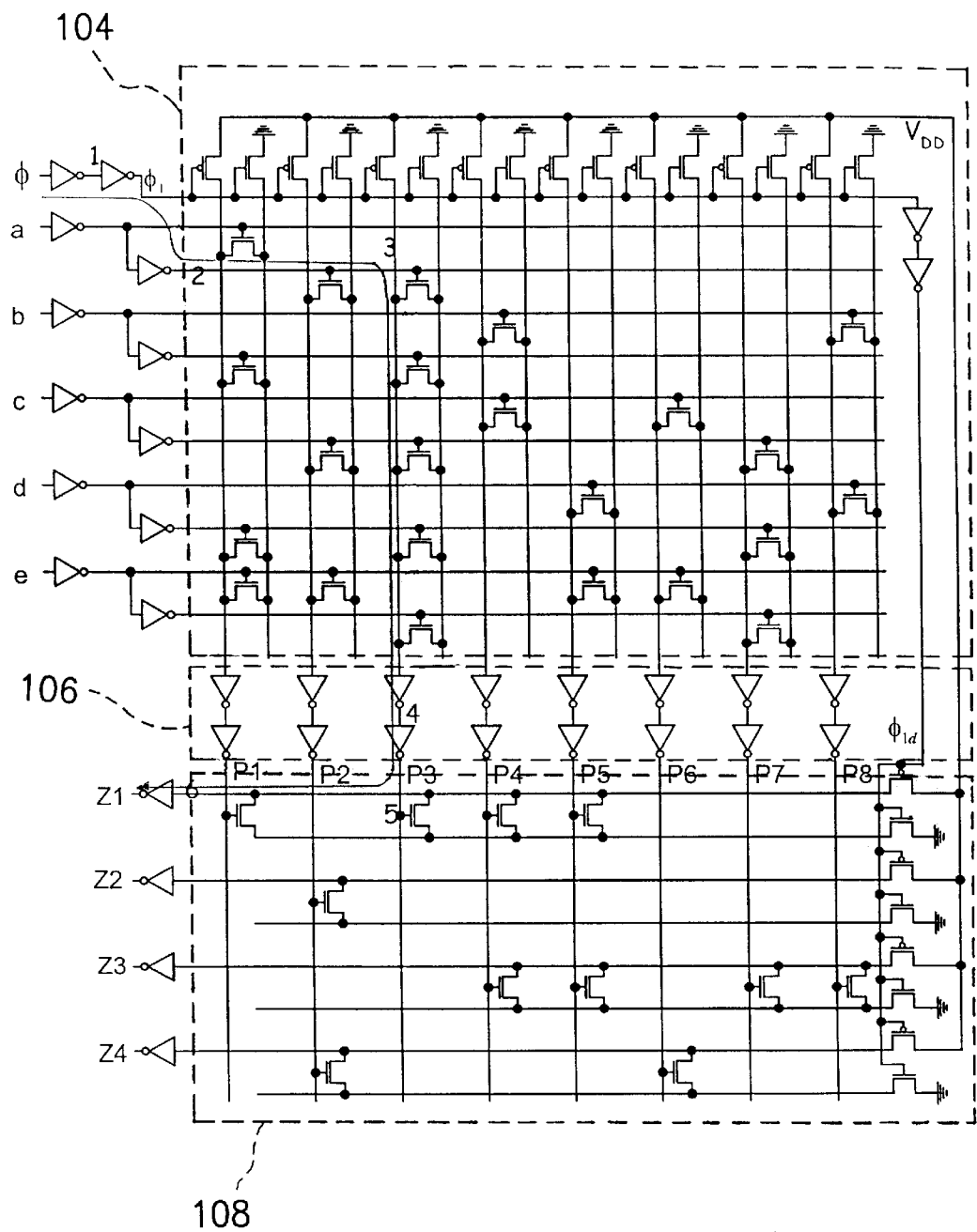
FIG. 2 is a circuit diagram of a 5×8×4 conventional clock-delayed PLA.
Figure 3A:
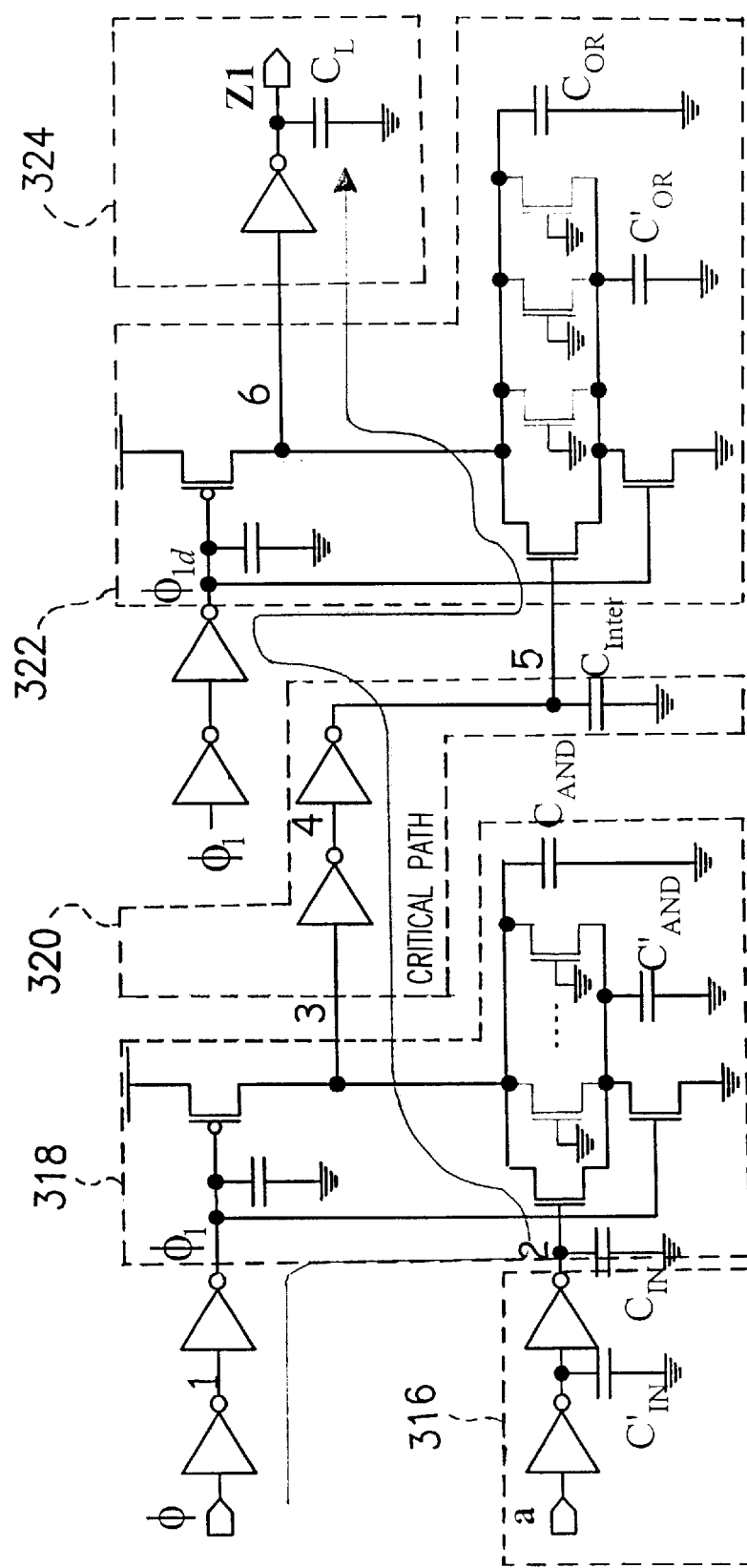
FIG. 3A is a circuit extracted from the critical path in FIG. 2.
Figure 3B:
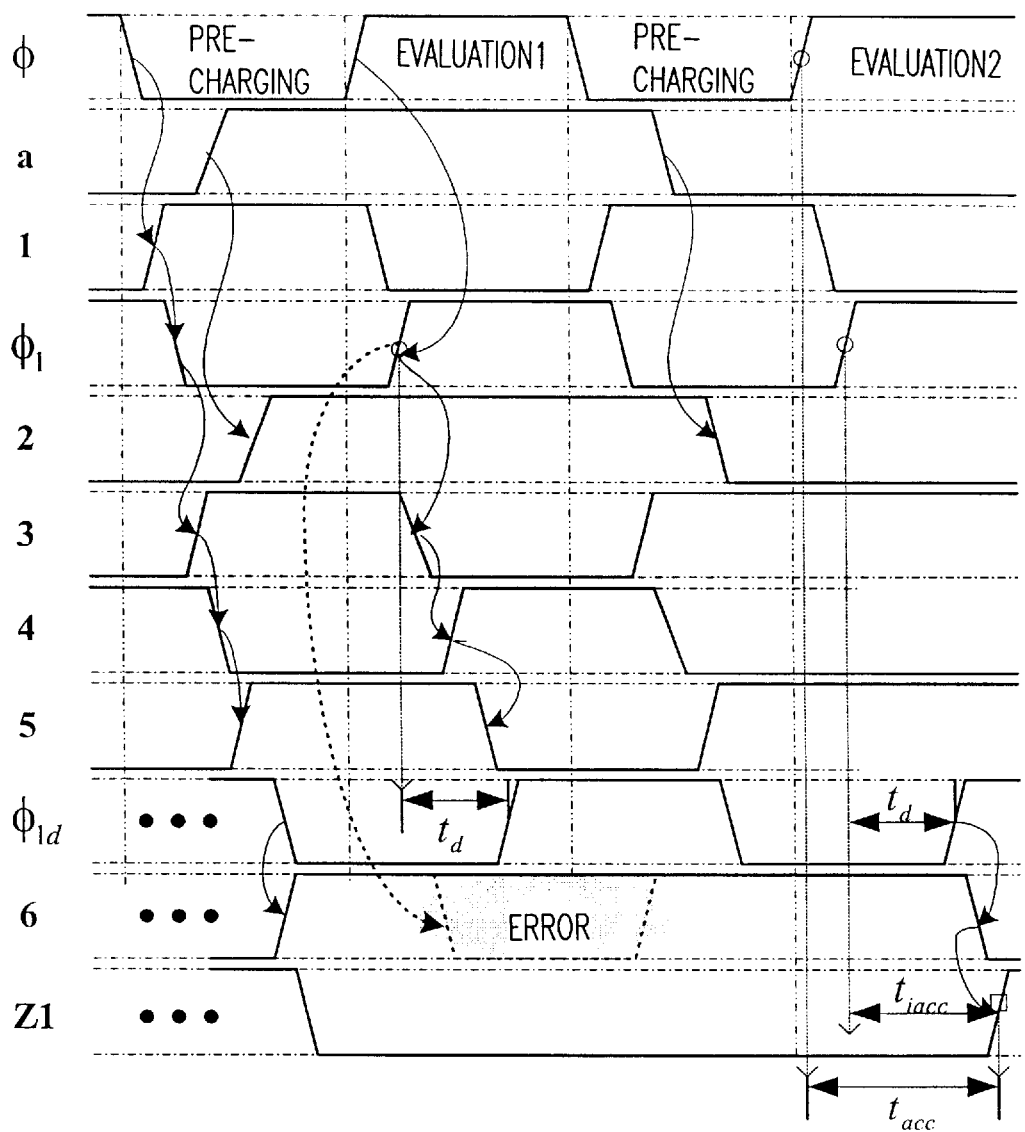
FIG. 3B is a diagram showing a set of signal waveforms related to the circuit shown in FIG. 3A.
Figure 4A:
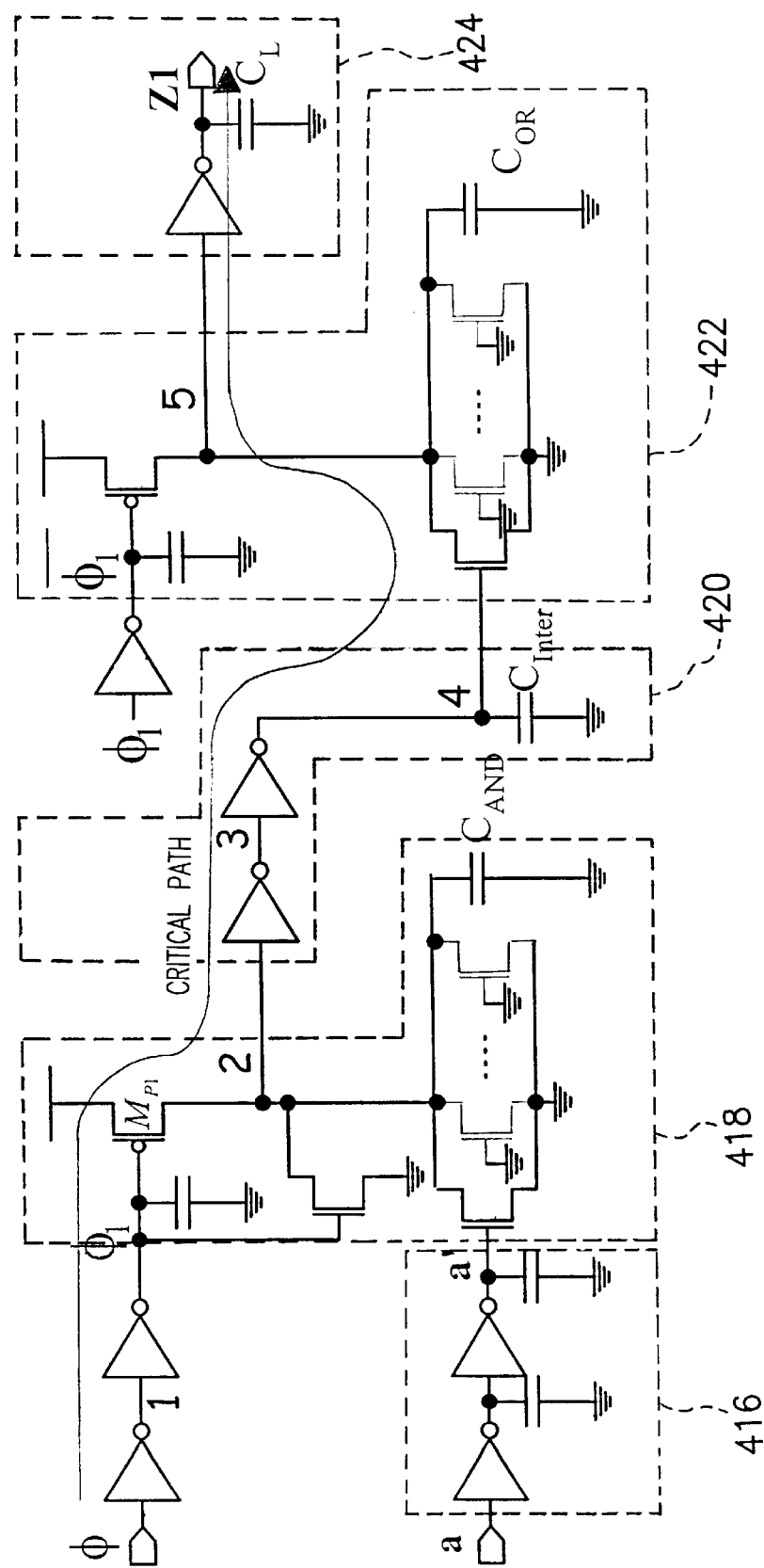
FIG. 4A is a critical path circuit diagram of Blair's PLA and a critical path through the circuit.
Figure 4B:
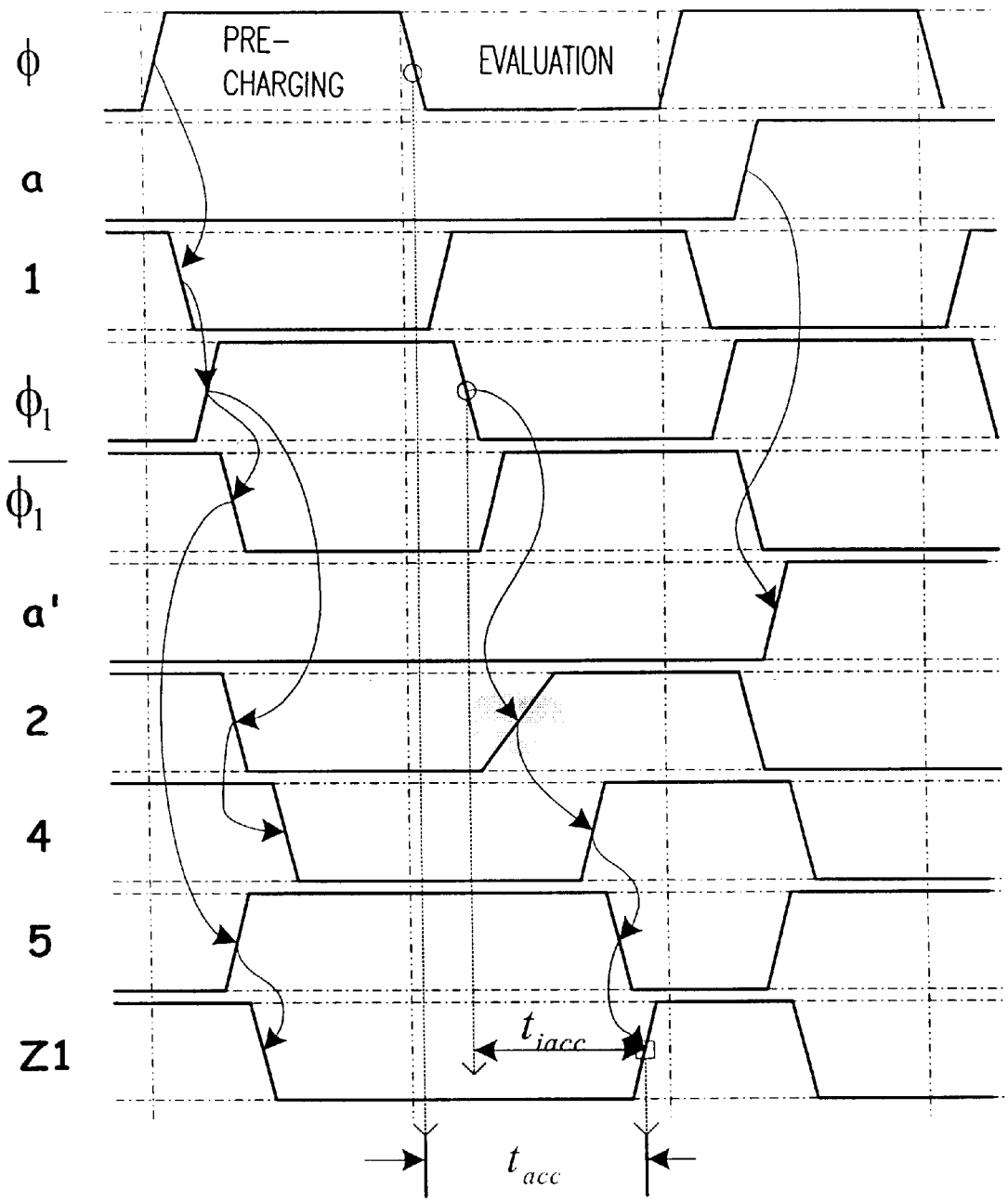
FIG. 4B is a timing diagram showing waveforms related to the signals in FIG. 4A.
Figure 5A:
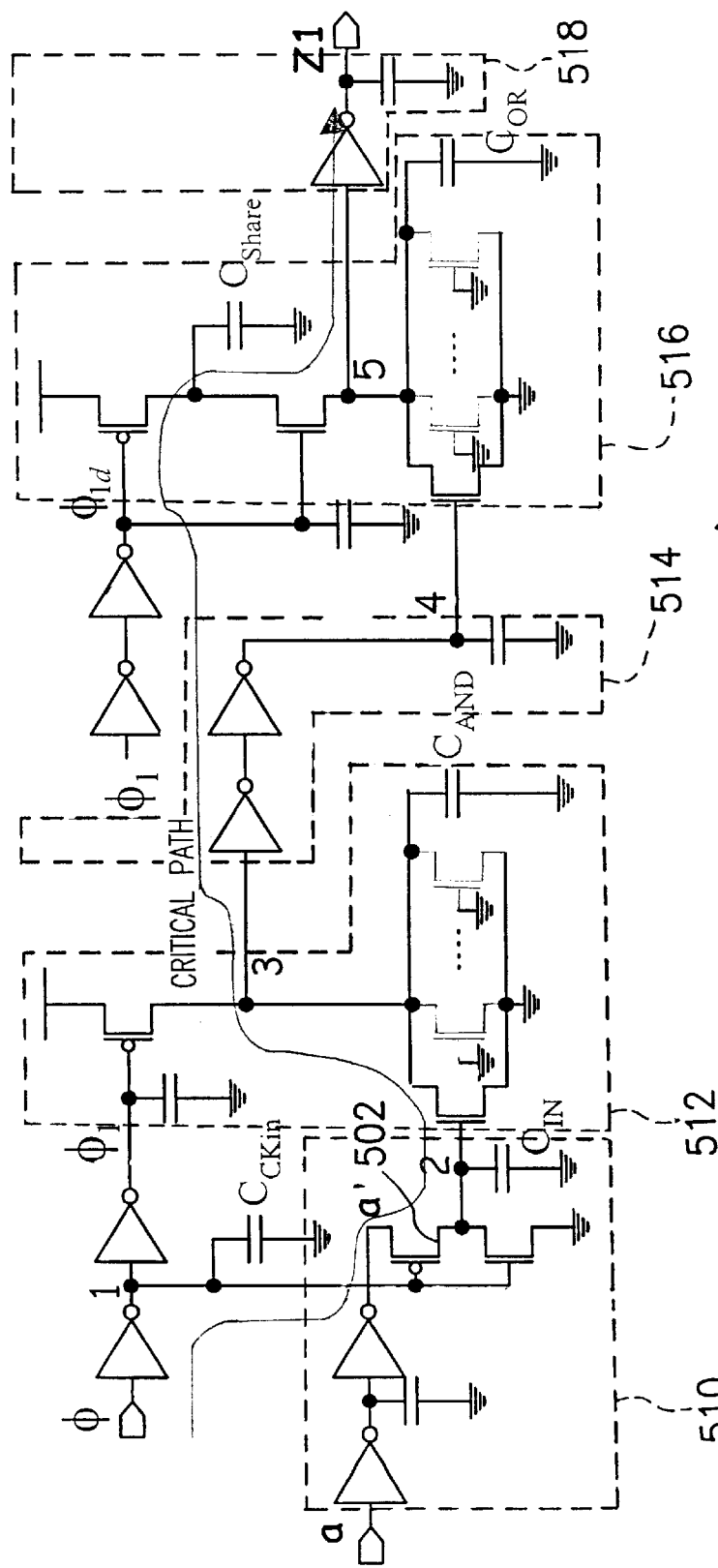
FIG. 5A is a critical path circuit diagram of Dhong's PLA.
Figure 5B:
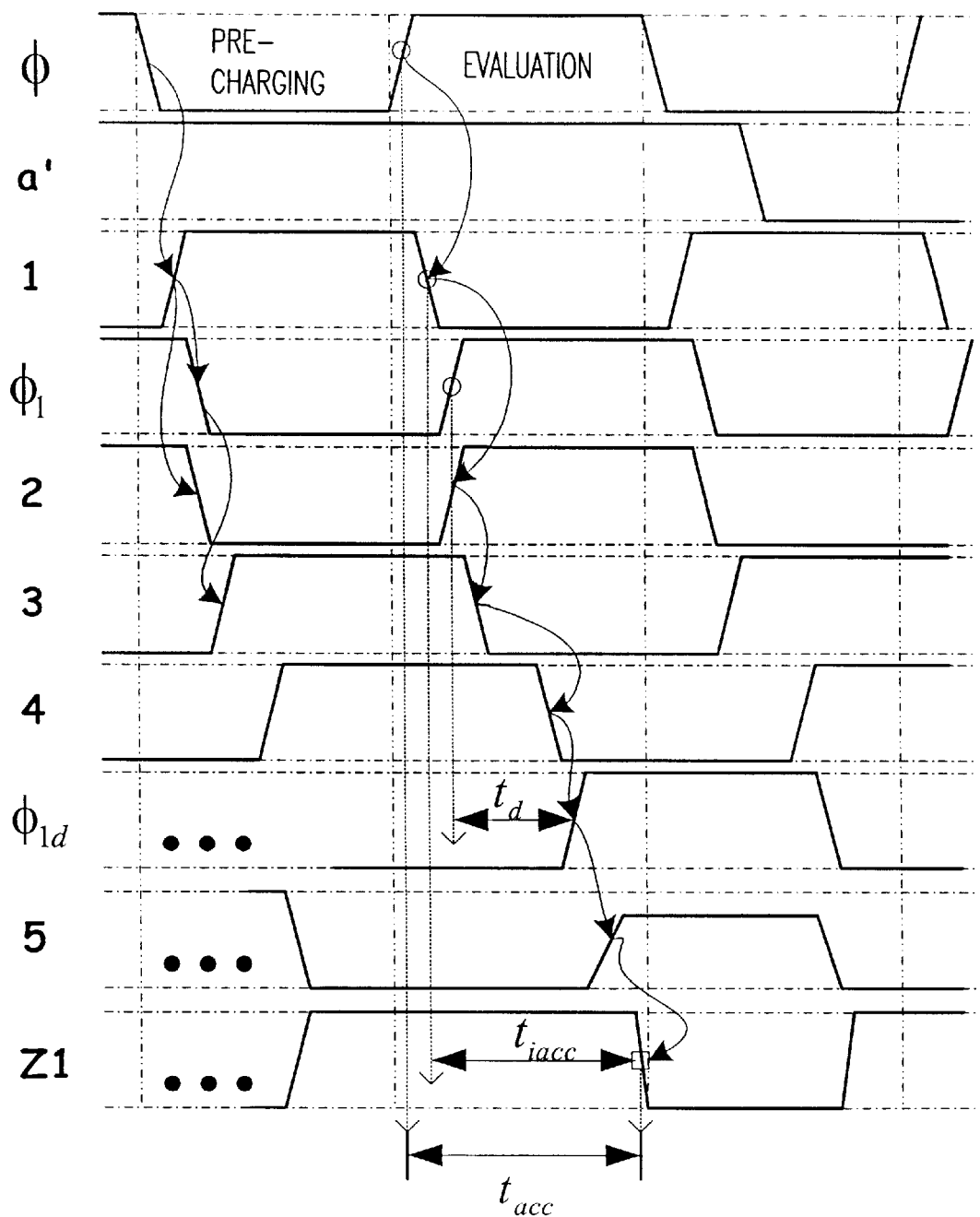
FIG. 5B is a timing diagram showing waveforms related to the signals in FIG. 5A.
Figure 6A:
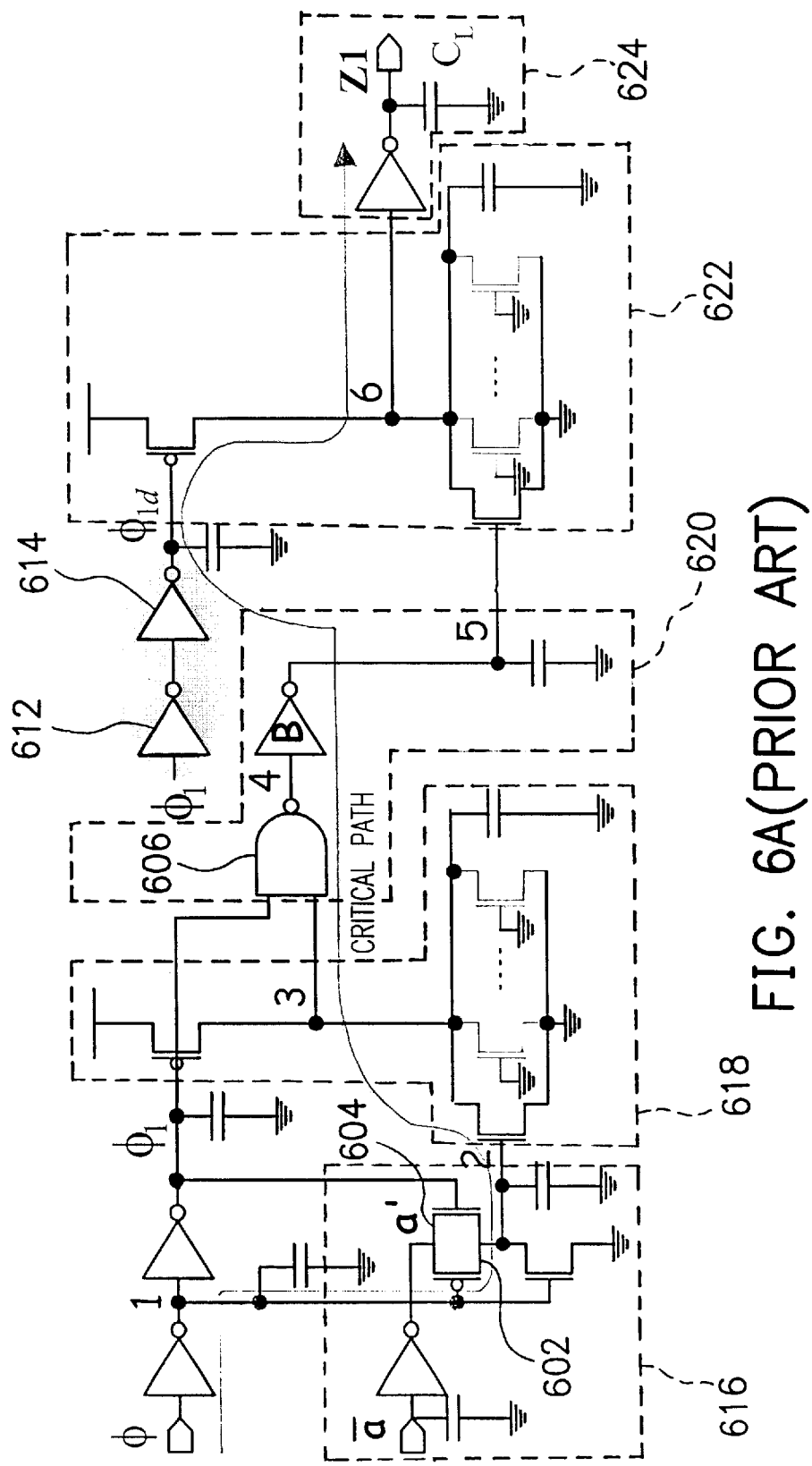
FIG. 6A is a critical path circuit diagram of Wang's PLA.
Figure 6B:
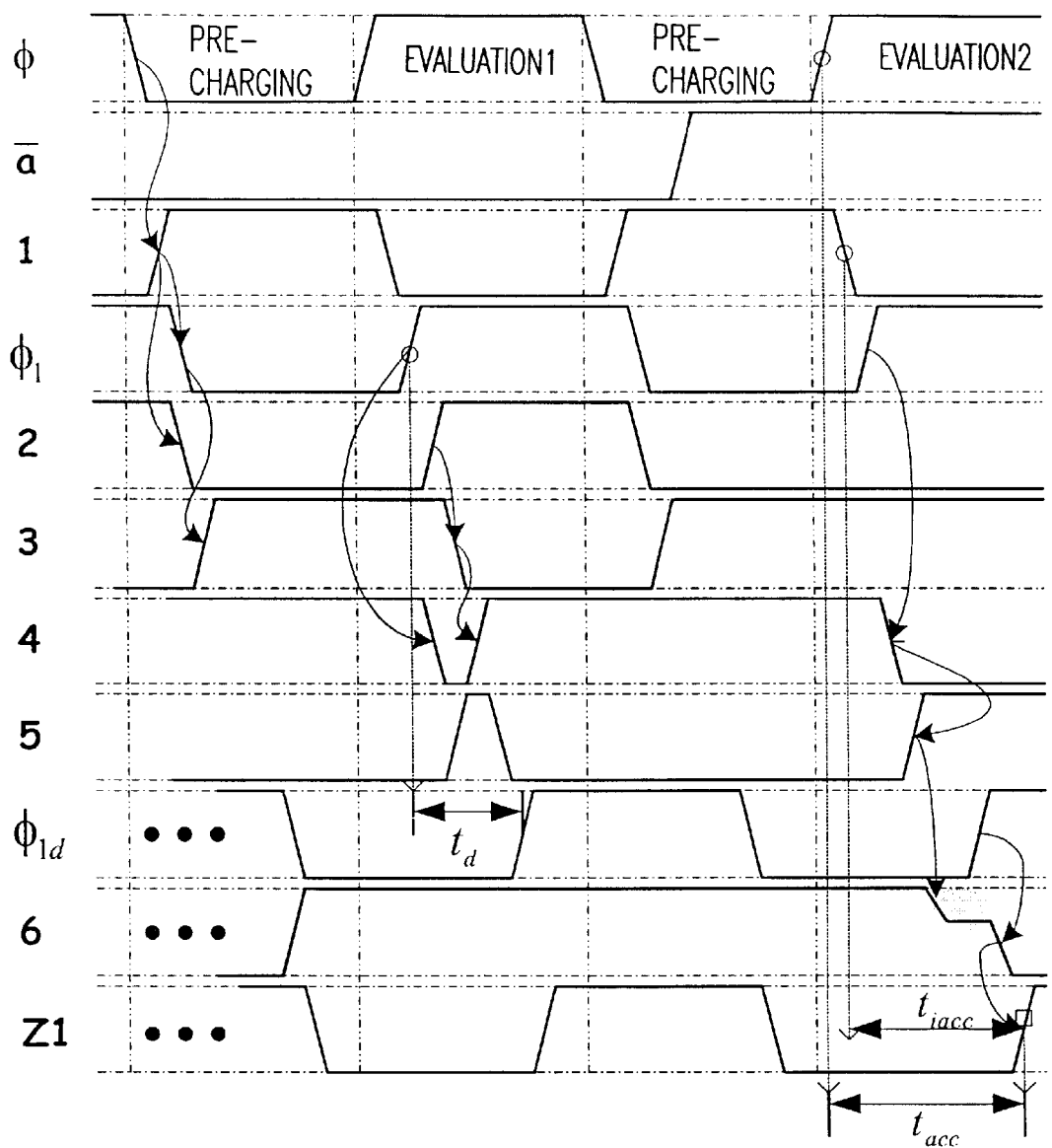
FIG. 6B is a timing diagram showing waveforms related to the signals in FIG. 6A.

Reference will now be made in detail to the present preferred embodiments of the invention, examples of which are illustrated in the accompanying drawings. Wherever possible, the same reference numbers are used in the drawings and the description to refer to the same or like parts.

Figure 7:
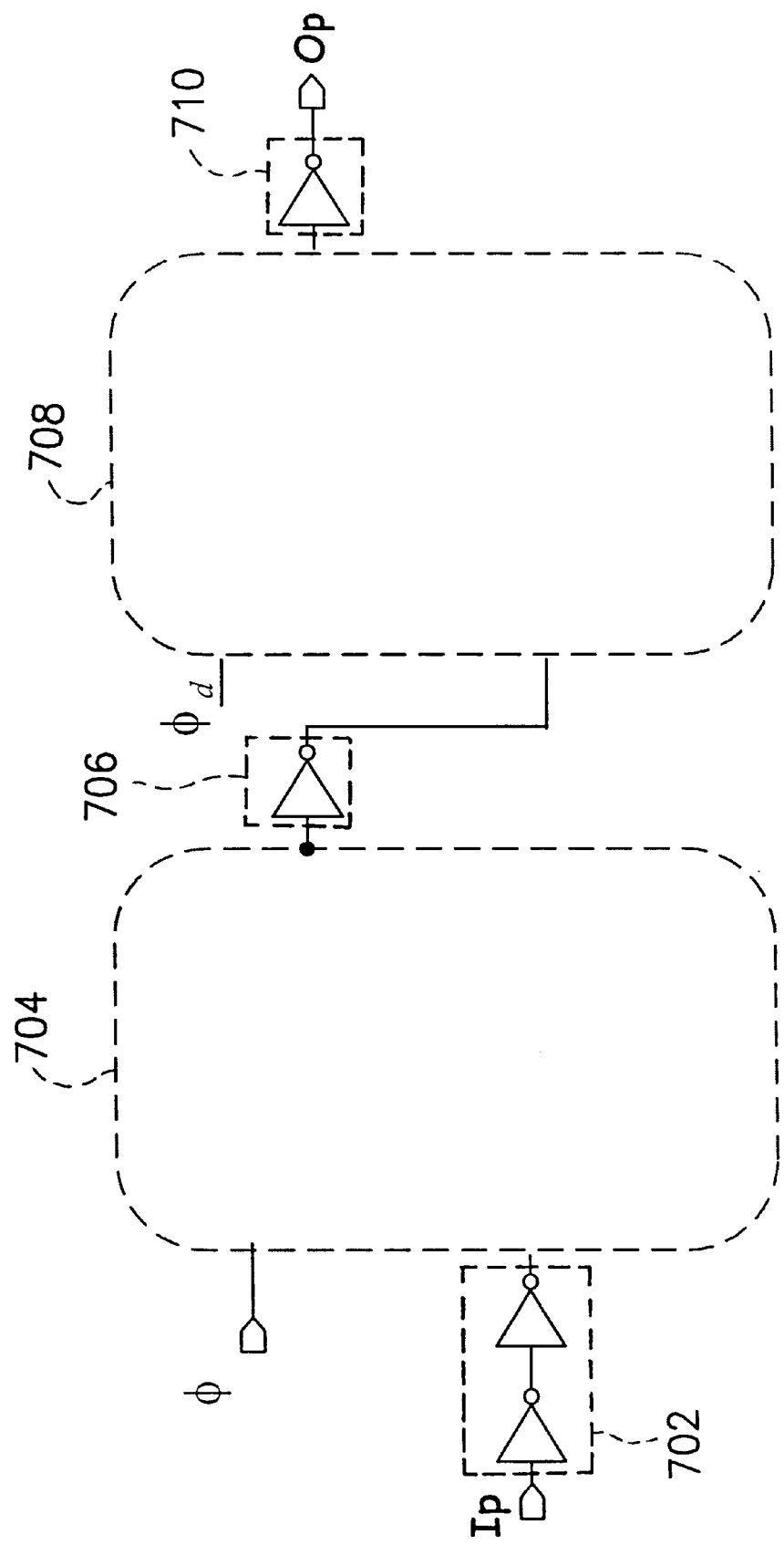
FIG. 7 is a block diagram showing a single output path of the programmable logic array circuit according to one preferred embodiment of this invention.

FIG. 7 is a block diagram showing a single output path of the programmable logic array circuit according to one preferred embodiment of this invention. As shown in FIG. 7, the low power programmable logic array circuit includes an input buffer 702: the input terminal of the input buffer 702 is coupled to an input signal, an AND-plane circuit 704: the input terminal of the AND-plane circuit 704 is coupled to the output terminal of the input buffer 702, an inter-plane buffer 706: the input terminal of the inter-plane buffer is coupled to the output terminal of the AND-plane circuit 704, an OR-plane circuit 708: the input terminal of the OR-plane circuit 708 is coupled to the output terminal of the inter-plane buffer 706, and an output buffer 710: the input terminal of the output buffer 710 is coupled to the output terminal of the OR-plane circuit 708 and the output terminal of the output buffer 710 is coupled to an output signal line.

FIGS. 8A through 8D are circuit diagrams showing a few assembly methods of the low power programmable logic array circuit according to this invention. The low power programmable logic array circuit includes an AND-plane circuit 704 and an OR-plane circuit 708. The selectable combination includes the AND-plane dynamic gates in the AND-plane circuit 704 and the OR-plane dynamic gates in the OR-plane circuit 708. The assembling method includes the following steps.

According to the AND-plane low potential power loss when the AND-plane dynamic gate outputs a low potential, the AND-plane high potential power loss when the AND-plane dynamic gate outputs a high potential and the probability of the AND-plane circuit 704 at a high potential when the AND-plane dynamic gate outputs a high potential, a selection between the assembly AB 805 and the assembly AA 801 is carried out to pick up an AND-plane operating circuit for the AND-plane circuit 704. The transition power loss in the assembly AB 805 when the AND-plane dynamic gate 813 outputs a low potential is lower than the transition loss in the assembly AA 801 when the AND-plane dynamic gate 809 outputs a low potential. On the other hand, the transition loss in the assembly AA 801 when the AND-plane dynamic gate 809 outputs a high potential is lower than the transition power loss in the assembly AB 805 when the AND-plane dynamic gate 813 outputs a high potential.

According to the OR-plane low potential power loss when the OR-plane dynamic gate outputs a low potential, the OR-plane high potential power loss when the OR-plane dynamic gate outputs a high potential and the probability of the OR-plane circuit 708 at a high potential when the OR-plane dynamic gate outputs a high potential, a selection between the OR-plane new dynamic circuit and the OR-plane conventional footless dynamic circuit is carried out to pick up an OR-plane operating circuit for the OR-plane circuit 708. The transition power loss in the assembly OB 807 when the OR-plane dynamic gate 815 outputs a low potential is lower than the transition loss in the assembly OA 803 when the OR-plane dynamic gate 811 outputs a low potential. On the other hand, the transition loss in the assembly OA 803 when the OR-plane dynamic gate 811 outputs a high potential is lower than the transition power loss in the assembly OB 807 when the OR-plane dynamic gate 815 outputs a high potential. Finally, the selected AND-plane operating circuit and the selected OR-plane operating circuit are combined to produce a low power programmable logic array circuit.

The selection of either the assembly AB 805 or the assembly AA 801 to serve as an AND-plane operating circuit is achieved through an AND-plane effective power inequality. The AND-plane effective power inequality is:

$$P_{AND,1(new)}\alpha_{AND,1} + P_{AND,0(new)}(1-\alpha_{AND,1}) < P_{AND,1(org)}\alpha_{AND,1} + P_{AND,0(org)}(1-\alpha_{AND,1})$$

where $P_{AND,0}$ and $P_{AND,1}$ represent the low potential power loss when the AND-plane 704 dynamic gate outputs a low potential and the high potential power loss when the AND-plane 704 dynamic gate outputs a high potential respectively, and $\alpha_{AND,1}$ is the probability of the AND-plane dynamic gate outputting a high potential.

Figure 8A:
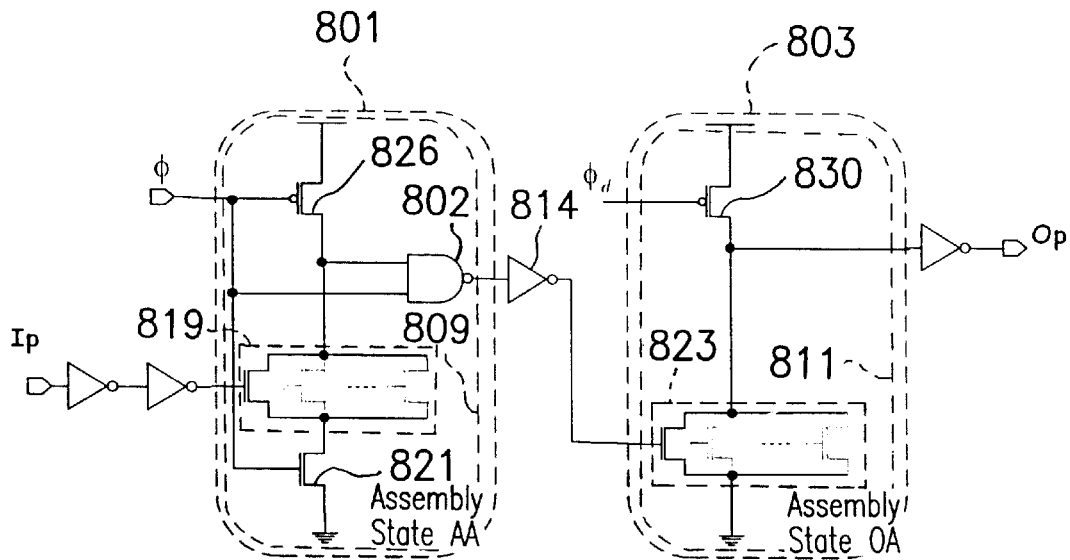
FIG. 8A is a circuit diagram showing an AA assembly according to this invention.
Figure 8B:
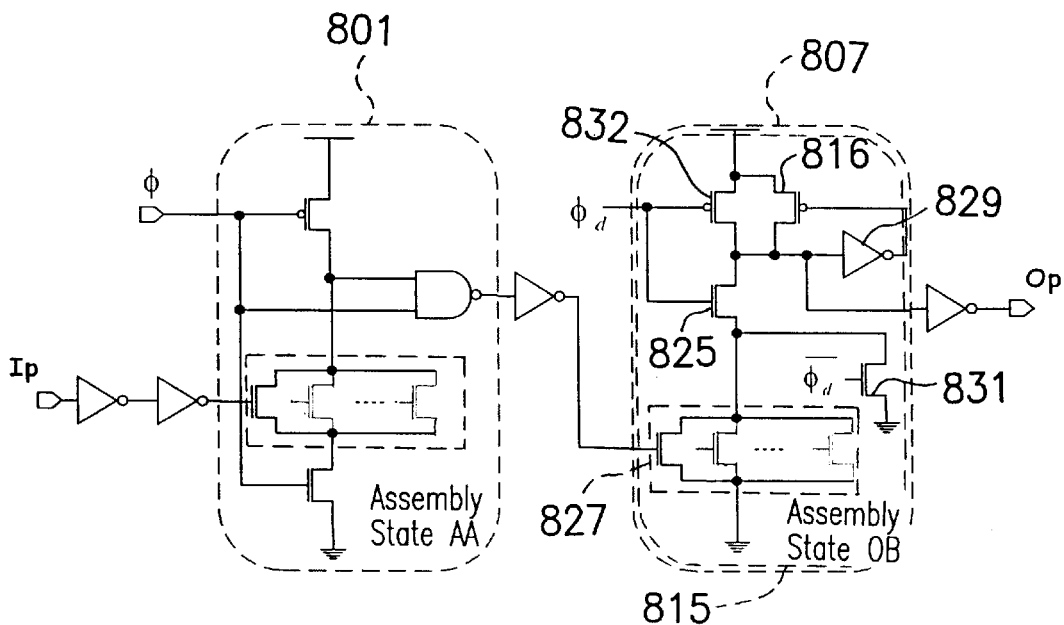
FIG. 8B is a circuit diagram showing an AB assembly according to this invention.
Figure 8C:
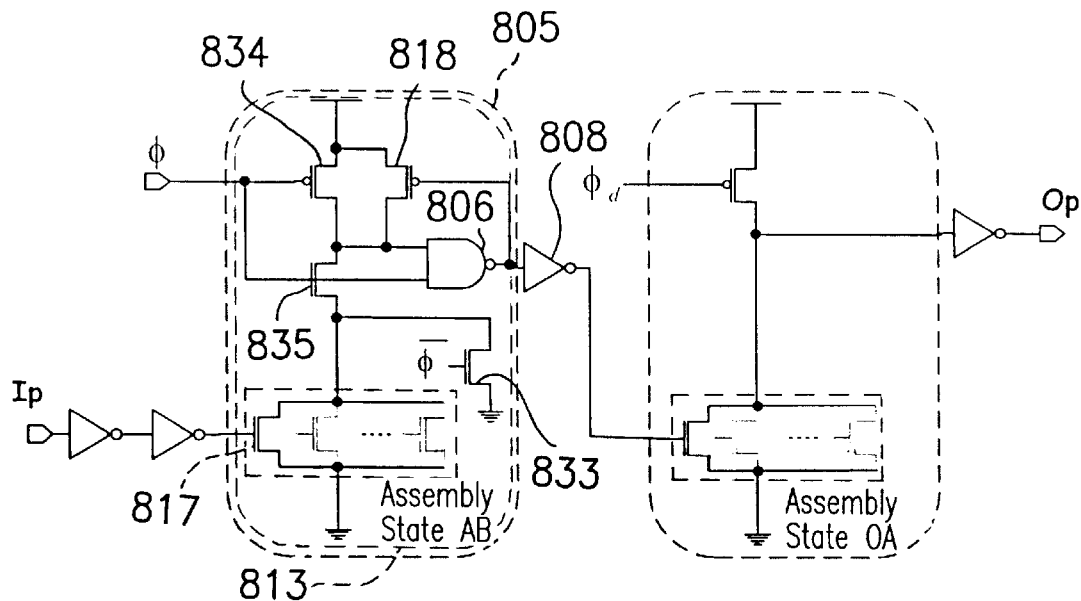
FIG. 8C is a circuit diagram showing a BA assembly according to this invention.
Figure 8D:
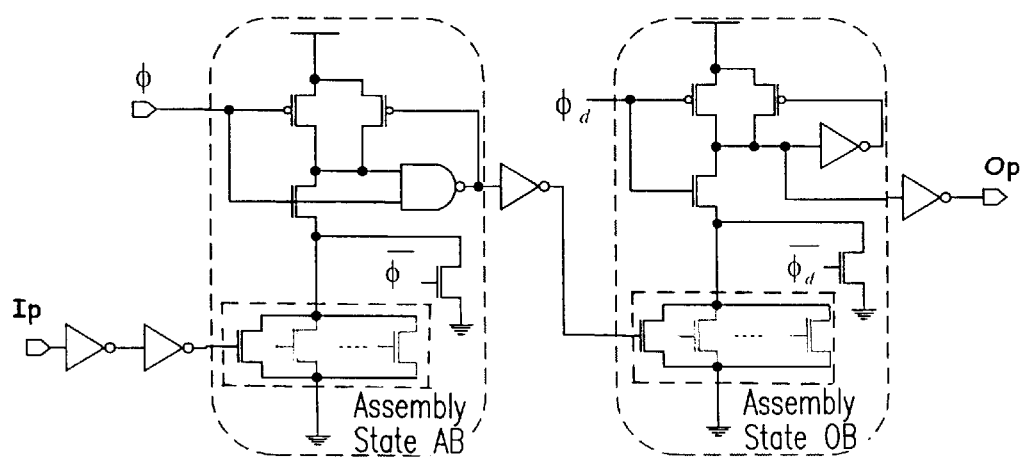
FIG. 8D is a circuit diagram showing a BB assembly according to this invention.

As shown in FIG. 8C, the AND-plane assembly AB 805 of the AND-plane circuit 704 includes a PMOS transistor 834, an NMOS transistor 835, a PMOS transistor 818, an NMOS transistor 833, a parallel connected NMOS transistor network 817 and an NAND gate 806. The source terminal of the PMOS transistor 834 is connected to a voltage source. The gate terminal of the PMOS transistor 834, the gate terminal of the NMOS transistor 835 and the input terminal of the NAND gate 806 are all coupled to the input clock signal ψ. The drain terminal of the PMOS transistor 834 is coupled to the drain terminal of the NMOS transistor 835 and another input terminal of the NAND gate 806. The source terminal of the PMOS transistor 818 is coupled to the voltage source. The gate terminal of the PMOS transistor 818 is coupled to the output terminal of the NAND gate 806. The drain terminal of the PMOS transistor 818 is coupled to another input terminal of the NAND gate 806. The gate terminal of the NMOS transistor 835 is coupled to the input clock signal ψ. The source terminal of the NMOS transistor 835 is coupled to the drain terminal of the parallel connected NMOS transistor network 817 and the drain terminal of the NMOS transistor 833. The gate terminal of the NMOS transistor 833 is coupled to an inverted signal of the input clock signal ψ. The source terminal of the NMOS transistor 833 is coupled to a ground. The source terminal of the NMOS transistor network 817 is connected to a ground and the gate terminal of the NMOS transistor network 817 is coupled to the output terminal of the input buffer. The output terminal of the NAND gate 806 is also coupled to the input terminal of the inter-plane buffer 808.

As shown in FIG. 8A, the AND-plane assembly AA 801 of the AND-plane circuit 704 includes a PMOS transistor 826, a NAND gate 802, a parallel connected NMOS transistor network 819 and an NMOS transistor 821. The source terminal of the PMOS transistor 826 is coupled to voltage source. The gate terminal of the PMOS transistor 826 is coupled to an input clock signal ψ. The drain terminal of the PMOS transistor 826 is coupled to the drain terminal of the parallel connected NMOS transistor network 819 and the input terminal of the NAND gate 802. The gate terminal of the parallel connected NNIOS transistor network 819 is coupled to the output terminal of the input buffer and the source terminal of the parallel connected NMOS transistor network 819 is coupled to the drain terminal of the NMOS transistor 821. The gate terminal of the NMOS transistor 821 is coupled to an input clock signal ψ. The source terminal of the NMOS transistor 821 is connected to a ground. The other input terminal of the NAND) gate 802 is coupled to the input clock signal ψ. The output terminal of the NAND gate 802 is coupled to the input terminal of the inter-plane buffer 814.

To select an OR-plane operating circuit between the assembly OB 807 and OA 803, the OR-plane also utilizes an OR-plane effective power inequality. The OR-plane effective power inequality is:

$$P_{OR,1(new)}\alpha_{OR,1}+P_{OR,0(new)}(1-\alpha_{OR,1})<P_{OR,1(org)}\alpha_{OR,1}P_{OR,0(org)}(1-\alpha_{OR,1})$$

where $P_{OR,0}$ and $P_{OR,1}$ represent the low potential power loss and the high potential power loss of the OR-plane 708 dynamic gate respectively, and $\alpha_{OR,1}$ and $(1-\alpha_{OR,1})$ represent the probability of the OR-plane dynamic gate having a high potential and a low potential respectively.

As shown in FIG. 8A, when the OR-plane circuit 708 meets the OR-plane effective power inequality, the assembly OB 807 is used. Conversely, the assembly OA 803 is used. The OA 803 circuit in the OR-plane circuit 708 includes a PMOS transistor 830 and a parallel-connected NMOS transistor network 823. The source terminal of the PMOS transistor 830 is connected to a voltage source and the gate terminal of the PMOS transistor 830 is coupled to an input clock signal $\psi_d$. The drain terminal of the PMOS transistor 830 is coupled to the drain terminal of the parallel-connected NMOS transistor network 823 and the input terminal of the output buffer. The gate terminal of the parallel-connected NMOS transistor network 823 is coupled to the output terminal of the inter-plane buffer and the source terminal of the parallel-connected NMOS transistor network 823 is connected to a ground.

As shown in FIG. 8B, the OB 807 assembly in the OR-plane circuit 708 includes a PMOS transistor 832, an NMOS transistor 825, a PMOS transistor 816, an inverter 829, an NMOS transistor 831 and a parallel-connected NMOS transistor network 827. The source terminal of the PMOS transistor 832 is connected to a voltage source and the gate terminal of the PMOS transistor 832 is connected to the input clock signal $\psi_d$. The drain terminal of the PMOS transistor 832 is coupled to the drain terminal of the NMOS transistor 825, the drain terminal of the PMOS transistor 816, the input terminal of the output buffer and the input terminal of the inverter 829. The source terminal of the PMOS transistor 816 is connected to the voltage source and the gate terminal of the PMOS transistor 816 is connected to the output terminal of the inverter 829. The drain terminal of the PMOS transistor 816 is coupled to the input terminal of the inverter 829. The gate terminal of the NMOS transistor 825 is connected to the input clock signal $\psi_d$. The source terminal of the NMOS transistor 825 is connected to the drain terminal of the NMOS transistor 831 and the parallel-connected NMOS transistor network 827. The gate terminal of the NMOS transistor 831 is connected to the inverted clock signal of input clock signal $\psi_d$. The source terminal of the NMOS transistor 831 is connected to a ground potential. The gate terminal of the parallel-connected NMOS transistor network 827 is connected to the output terminal of the inter-plane buffer and the source terminal of the parallel-connected NMOS transistor network 827 is connected to a ground potential. The input terminal of the inverter 829 is connected to the input terminal of the output buffer. The output terminal of the inverter 829 is connected to the gate terminal of the PMOS 816.

In this invention, two different sub-assemblies can be selected to carry out the required functions. These sub-assemblies are characterized by the first assembly having a lower power loss when the dynamic gate outputs a high potential and the second assembly having a lower power loss when the dynamic gate outputs a low potential. The following is a discussion of the types of alternative circuits and the criteria for selecting a particular circuit.

According to the aforementioned analysis, in the AND-plane circuit 704, when the probability of the AND-plane dynamic gate outputting a high potential is higher, the AND-plane conventional dynamic circuit has lower power consumption. This is because the circuit having a high potential output has no power consumption other than a leakage current. Therefore, in selecting the assembly AA for the AND-plane circuit 704, the AND-plane conventional dynamic circuit 801 is chosen as the assembly when the AND-plane dynamic gate 809 outputs a high potential. In addition, to lower the switching probability of the inter-plane buffer 706, the output terminal of the dynamic gate is connected a two-input terminal NAND gate 802. One of the input terminals is connected to the output terminal of the AND-plane circuit 704 while the other input terminal is connected to the input clock control ψ. In selecting the assembly AB for the AND-plane circuit 704, an AND-plane new dynamic circuit is chosen. This is because a lower transition power loss is obtained when the AND-plane dynamic gate 813 outputs a low potential. In this invention, an output terminal having a NAND gate 806 assembly is chosen to lower the transition probability of the inter-plane buffer 706.

With reference to FIGS. 8A to 8D, the assembly AA, AB, BA and BB are the possible single paths for a programmable logic array (PLA). For example, in the pre-charging phase, low voltages are applied to the input of the OR-plane circuit 708. Therefore, using an OR-plane conventional footless dynamic circuit in the OR-plane circuit 704 when the OR-plane dynamic gate 811 outputs a high potential is able to reduce power loss. Conversely, this invention employs an OR-plane new dynamic circuit similar to the AND-plane assembly AB 805. However, the OR-plane new dynamic circuit used in the OR-plane circuit 708 is not limited to any particular type. The actual OR-plane new dynamic circuit can be selected from the R.O.C. Patent No. 90106570. If this invention employs the output terminal inverted feedback circuit as described in R.O.C. Patent No. 90106570, the circuit is similar to the ones shown in FIGS. 8B and 8D.

Figure 9:
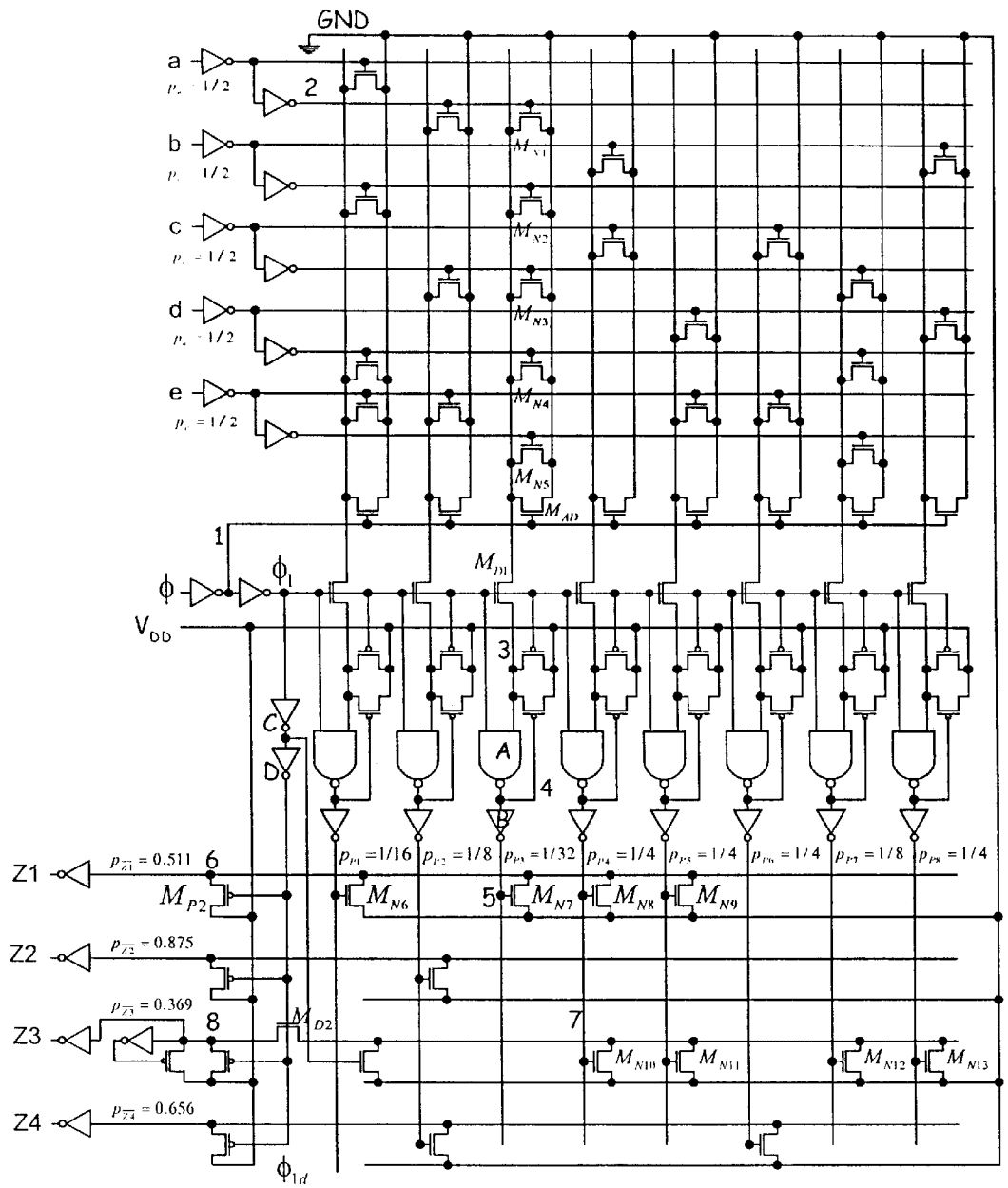
FIG. 9 is a circuit diagram showing an actual 5×8×4 programmable logic array according to this invention.
Figure 10A:
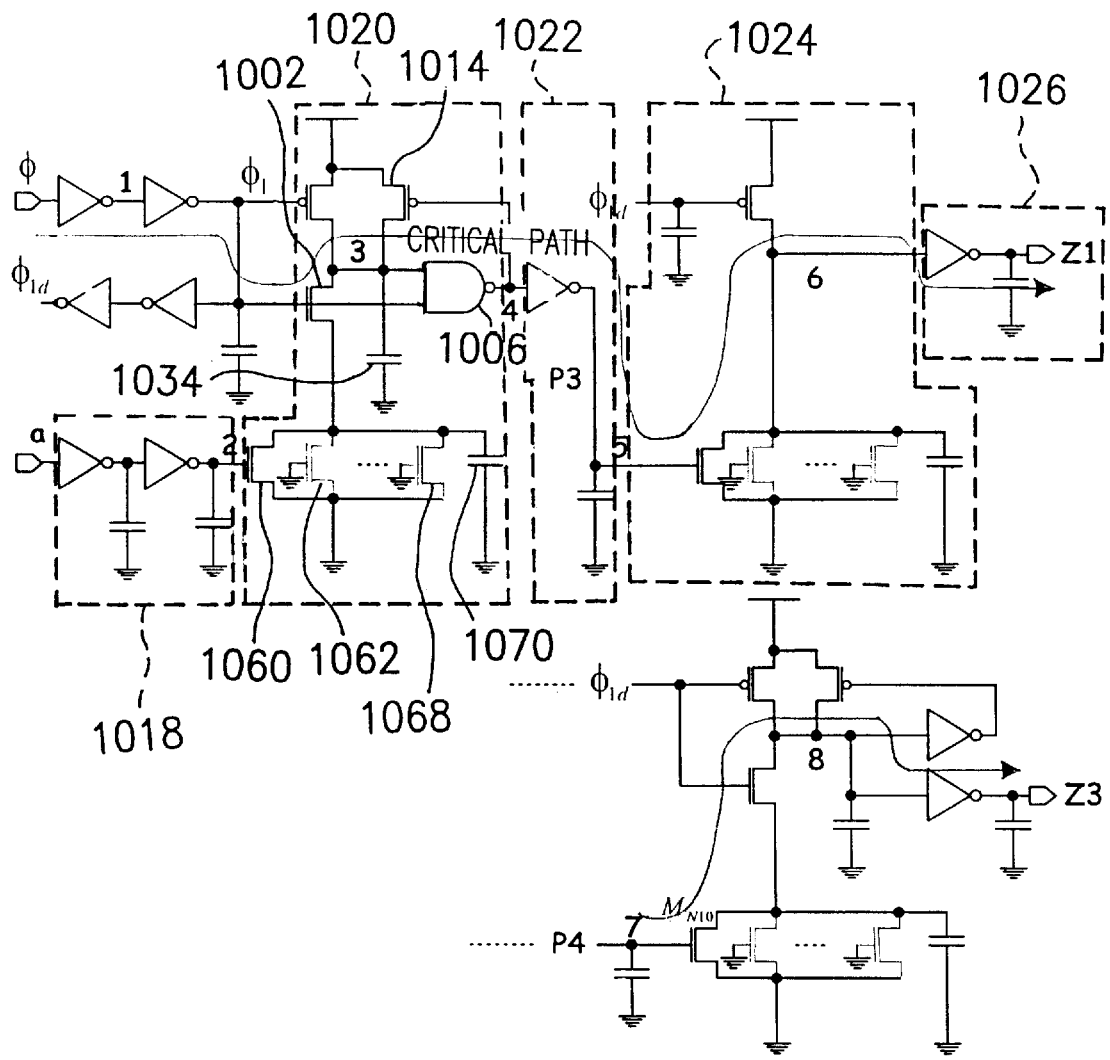
FIG. 10A is a circuit diagram showing the critical path of the programmable logic array shown in FIG. 9.
Figure 10B:
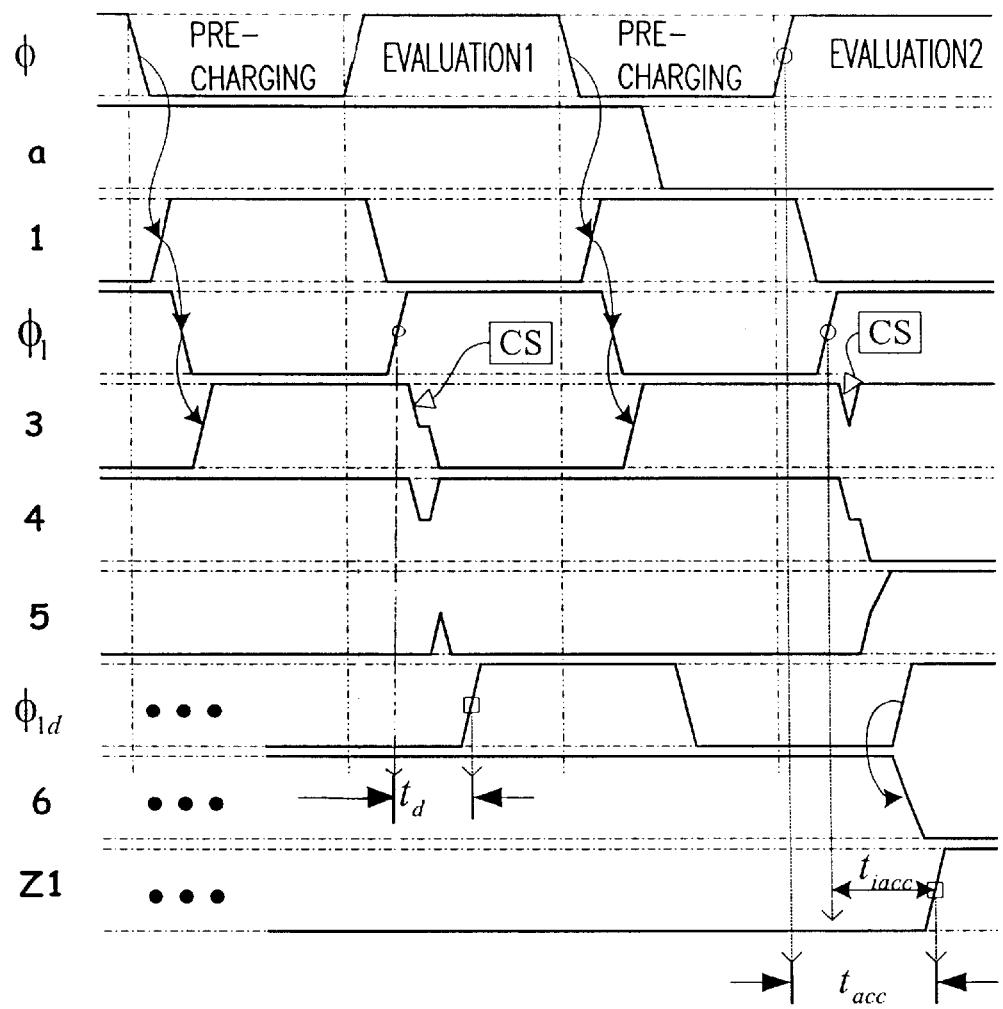
FIG. 10B is a timing diagram showing waveforms related to the signals in FIG. 10A.

FIG. 9 is a circuit diagram showing an actual 5×8×4 CMOS programmable logic array (PLA) according to this invention. The CMOS PLA completes all four Boolean functions (1)~(4) described earlier. FIG. 10A is a circuit diagram showing the critical path of the PLA shown in FIG. 9. FIG. 10B is a timing diagram showing waveforms related to the signals in FIG. 10A. The PLA of this invention operates under two phases, the pre-charging phase and the evaluation phase. When the internal clocking signal $\psi_1$ and $\psi_{1d}$ are both low, the circuit operates in the pre-charging phase. Both nodes 3 and 6 are pre-charged to a high potential. Since the NAND gate 1006 is controlled by the clocking signal $\psi_1$, the output node 5 of the inter-plane buffer 1022 is pulled down to a low potential. The PMOS transistor 1014 is a device for preventing charge re-distribution. All the input signals must be stabilized before the initialization of the evaluation phase. When the internal clock signal $\psi_1$ is at a high potential, the AND-plane 1020 proceeds to the evaluation phase first. Fundamentally, the dynamic circuit used in the AND-plane 1020 is similar to a conventional clock-delayed circuit except the conventional discharge N-type transistor 1002 is moved to a location between the output point and the parallel-connected NMOS transistors 1060~1068. Hence, the dynamic circuit and the conventional clock-delayed circuit are functionally identical except for some differences in electrical properties. If low voltages are applied to all inputs of the AND-plane 1020, a high potential must be maintained at node 3. However, the N-type transistor 1002 is opened and charges accumulating at node 3 are re-distributed to the capacitor 1070. To prevent problems due to charge re-distribution, a feedback P-type transistor 1014 is added to compensate for the lost charges from the capacitor 1034 and the capacitor 1070 so that the voltage at node 3 is pulled back to $V_{DD}$. On the other hand, if one of the input terminals receives a high voltage, the nodes 5 and 7 will remain at a low potential after an evaluation operation. Under the worst conditions, only one of the NMOS transistors (1060~1068) receives a high voltage. This NMOS transistor must leak out all charges stored in the parasitic capacitor. With this input combination, the longest time delay is produced.

The PLA of this invention is capable of circuit selection in both the AND-plane 704 and the OR-plane 708 for lowering power losses. To compare power losses, the circuits to be chosen by the AND-plane 704 and the OR-plane 708 must be pre-determined. If the PLA inputs are evenly distributed, the AND-plane 704 should use the assembly AB. The method of determining the OR-plane 708 includes the following steps. First, power loss data for these two circuits are determined, for example, as shown in Table 3, where $P_{OR,0}$ and $P_{OR,1}$ represent the power losses for circuit output value of low and high respectively. According to such data, the following is a description of the method of selecting a correct circuit assembly.

TABLE 3

OR-plane 708 power losses according to the PLA circuit of this invention

| | Power @ 100 MHz (mW) | | Power @ 50 MHz (mW) | |
|---|---|---|---|---|
| | $C_{share}$ | $M_{P1}$ | $P_{OR,0}$ | $C_{OR}$ |
| Assembly OB | 0.11 | 0.11 | 0.06 | 0.06 |
| Assembly OA | 0.18 | 0.00 | 0.09 | 0.00 |

For example, assume the operating frequency is 100 MHz. If the following inequality is satisfied, the OR-plane conventional footless dynamic circuit can be replaced by an OR-plane new dynamic circuit. In other words, the assembly OA 803 can be replaced by the assembly OB 807.

$$0.11 \times \alpha_{OR,1} + 0.11(1-\alpha_{OR,1}) < 0 \times \alpha_{OR,1} + 0.18(1-\alpha_{OR,1}) \Rightarrow \alpha_{OR,1} < 0.39$$

The above inequality means that: if the probability of a high output from the OR-plane 708 is smaller than 39%, an OR-plane assembly OB 807 should be used so that a lower power loss is obtained. This type of design flexibility is also shown in FIG. 9, where the output $\overline{Z3}$ of the OR-plane 708 is implemented using the new OR-plane dynamic circuit. This is because the probability of a high output potential is $\alpha_{\overline{Z3},1}=0.369$. If the input signal transition probability of the AND-plane 704 is not evenly distributed, a method similar to the above can be used to find an exchanging point to serve as a base for circuit change.

In conclusion, one major advantage of this invention is the use of an inequality to determine whether a conventional circuit or a new dynamic circuit in AND-plane 704 and OR-plane 708 circuit can save more power.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A low-power programmable logic array circuit assembling method, wherein the circuit includes an AND-plane and an OR-plane such that the AND-plane includes AND-plane dynamic gates and the OR-plane includes OR-plane dynamic gates, the assembling method comprising the steps of:

according to the AND-plane low potential power loss when a low potential is output from the AND-plane dynamic gates, the AND-plane high potential power loss when a high potential is output from the AND-plane dynamic gates and the probability of a high potential at the AND-plane when the AND-plane dynamic gates output a high potential, a selection between AND-plane new dynamic circuit and AND-plane conventional dynamic circuit is carried out to pick up an AND-plane operating circuit for the AND-plane, wherein between the AND-plane dynamic gates of the AND-plane new dynamic circuit outputting a low potential and the AND-plane dynamic gates of the AND-plane conventional dynamic circuit outputting a low potential, the former has a lower transition power loss, on the contrary, between the AND-plane dynamic gates of the AND-plane new dynamic circuit outputting a high potential and the AND-plane dynamic gates of the AND-plane conventional dynamic circuit outputting a high potential, the latter has a lower transition power loss;

according to OR-plane low potential power loss when a low potential is output from the OR-plane dynamic gates, OR-plane high potential power loss when a high potential is output from the OR-plane dynamic gates and probability of a high potential at the OR-plane when the OR-plane dynamic gates output a high potential, a selection between OR-plane new dynamic circuit and OR-plane conventional footless dynamic circuit is carried out to pick up an OR-plane operating circuit for the OR-plane, wherein between the OR-plane dynamic gates of the OR-plane new dynamic circuit outputting a low potential and the OR-plane dynamic gates of the OR-plane conventional footless dynamic circuit outputting a low potential, the former has a lower transition power loss, on the contrary, between the OR-plane dynamic gates of the OR-plane new dynamic circuit outputting a high potential and the OR-plane dynamic gates of the OR-plane conventional footless dynamic circuit outputting a high potential, the latter has a lower transition power loss; and combining the selected AND-plane operating circuit and the selected OR-plane operating circuit to produce the low power programmable logic array.

2. The low-power programmable logic array assembling method of claim 1, wherein the step of selecting between the AND-plane new dynamic circuit and the AND-plane conventional dynamic circuit to serve as an AND-plane operating circuit for the AND-plane includes using an AND-plane effective power inequality, the inequality is:

$$P_{AND,1(new)}\alpha_{AND,1}+P_{AND,0(new)}(1-\alpha_{AND,1})<P_{AND,1(org)}\alpha_{AND,1}+P_{AND,0(org)}(1-\alpha_{AND,1})$$

where $P_{AND,0}$ and $P_{AND,1}$ represent the low potential power loss when the AND-plane dynamic gates output a low potential and the high potential power loss when the AND-plane dynamic gates output a high potential respectively, and $\alpha_{AND,1}$ is the probability of the AND-plane dynamic gate outputting a high potential.

3. The low-power programmable logic array assembling method of claim 1, wherein the step of selecting between the OR-plane new dynamic circuit and the OR-plane conventional footless dynamic circuit to serve as an OR-plane operating circuit for the OR-plane includes using an OR-plane effective power inequality, the inequality is:

$$P_{OR,1(new)}\alpha_{OR,1}+P_{OR,0(new)}(1-\alpha_{OR,1})<P_{OR,1(org)}\alpha_{OR,1}+P_{OR,0(org)}(1-\alpha_{OR,1})$$

where $P_{OR,0}$ and $P_{OR,1}$ represent the low potential power loss and the high potential power loss of the OR-plane dynamic gate respectively, and $\alpha_{OR,1}$ and $(1-\alpha_{OR,1})$ represent the probability of the OR-plane dynamic gate outputting a high potential and a low potential respectively.

4. The assembling method of claim 1, wherein the low-power programmable logic array circuit further includes:
   an input buffer having an input terminal coupled to an input signal and an output terminal coupled to the AND-plane circuit;
   an inter-plane buffer having an input terminal coupled to the AND-plane circuit and an output terminal coupled to the OR-plane circuit; and
   an output buffer having an input terminal coupled to the OR-plane output terminal and an output terminal coupled to an output signal line.

* * * * *